(12) United States Patent
Yang et al.

(10) Patent No.: US 8,461,866 B2
(45) Date of Patent: Jun. 11, 2013

(54) DEVICE FOR STORING PULSE LATCH WITH LOGIC CIRCUIT

(75) Inventors: Yu-Cheng Yang, Kaohsiung (TW); Hsin Wei Hung, Hsinchu (TW); Hung-Chun Li, Hsinchu (TW); Teng-Nan Liao, Hsinchu (TW)

(73) Assignee: Global Unichip Corporation, Hsinchu (TW)

( * ) Notice: Subject to any disclaimer, the term of this patent is extended or adjusted under 35 U.S.C. 154(b) by 0 days.

(21) Appl. No.: 13/064,841

(22) Filed: Apr. 20, 2011

(65) Prior Publication Data

US 2012/0025867 A1 Feb. 2, 2012

(30) Foreign Application Priority Data

Jul. 30, 2010 (TW) .............................. 99125375 A

(51) Int. Cl.
*H03K 17/16* (2006.01)
(52) U.S. Cl.
USPC .......................................................... 326/29

(58) Field of Classification Search
USPC ....................................... 326/37–41, 101, 29
See application file for complete search history.

(56) References Cited

U.S. PATENT DOCUMENTS

| | | | |
|---|---|---|---|
| 6,275,081 B1 * | 8/2001 | Flake | 327/202 |
| 6,480,019 B2 * | 11/2002 | Waldie et al. | 326/16 |
| 2009/0326854 A1 * | 12/2009 | Chakravadhanula et al. | 702/119 |

* cited by examiner

*Primary Examiner* — Thienvu Tran
(74) *Attorney, Agent, or Firm* — Bacon & Thomas, PLLC

(57) ABSTRACT

A device for storing pulse latch with logic circuit and thus having signal maintaining function is provided, wherein the device is composed of a data signal, a scan data input signal, a stored signal, a choosing data input signal, a time clock signal, a restoring signal, a first signal channel, a scan latch, a second signal channel, a pulse latch, a normal output signal, an output signal, a first OR gate, a second OR gate, a third OR gate, a AND gate and an inverter connecting to one another. The device may store the data when being switch off and restore the data when being switch on again.

1 Claim, 8 Drawing Sheets

DEVICE FOR STORING PULSE LATCH WITH LOGIC CIRCUIT

BACKGROUND OF THE INVENTION

1. Field of the Invention

The present invention generally relates to a pulse latch device, and more particularly to a device for storing pulse latch with logic circuit and thus having data storage function.

2. Description of the Prior Art

A conventional pulse latch can't be applied to the circuit design with low power and low energy consumption since the electronic device can't store data when being switch off, and thus the data would be disappeared or lost after the electronic device is switch off. Therefore, a storage component unaffected by the power must be added in a logic circuit, i.e. consuming additional times to store the data in and to restore the data from a non-power-off storage component. However, the method consumes not only additional storing and restoring times but also additional electric powers.

FIG. 1A illustrates a schematic diagram of a conventional latch circuit device, wherein the number 101 and the symbol "D" represent an input data signal, the number 102 and the symbol "SI" (scan in) represent to input a scan data signal, the number 103 and the symbol "SE" (scan enable) represent to choose data, i.e. to choose to input data signal from D or SI, the number 104 and the symbol "CK" represent a time clock signal, the number 105 and the symbol "Scan Latch" represent to scan the latch, the number 106 and the symbol "0", "1" represent a signal channel of a digital signal being 0 or 1, the number 107 and the symbol "Latch" represent the pulse latch, and the number 108 and the symbol "Q" represent a normal output signal. Herein, the above-mentioned signals are connected to one another by a circuit.

FIG. 1B illustrates a time clock signal diagram of a conventional latch circuit, and the lateral axis is divided into 5 states from left to right, comprising:

"Active" representing at a normal operating state;
"Enter Sleep" representing to enter into a sleep state;
"Sleep" representing at a sleep state;
"Leave Sleep" representing to leave from a sleep state; and
"Active" representing at a normal operating state.

In addition, the vertical axis at left side in FIG. 1B is divided into 4 signals from top to bottom comprising a 110SleepEn signal, a 111NSLEEPIN signal, a 112CK signal and a 113Q signal with functions different from one another. Thus, as variations of signal waves illustrated in FIG. 1B, the conventional latch circuit can't store the data, i.e. the data is lost, after the conventional latch circuit is switch off. Hence, the conventional pulse latch can't store the data due to the stored data will be lost after the conventional pulse latch is switch off, thus the data must be stored in a non-power-off storage component which consumes additional times to store and restore the data. Note that the method also consumes additional electric powers and thus unable to applied to a lower power circuit device.

Accordingly, it is important to provide a new pulse latch circuit for providing a latch circuit with higher efficiency and storage function, thereby increasing the storage efficiency and decreasing power consuming.

SUMMARY OF THE INVENTION

The present invention is directed to a device for storing pulse latch and thus having signal maintaining function, which may store the data when being switch off and restore the data when being switch on again.

The present invention provides a device for storing pulse latch with logic circuit comprising a data signal, a scan data input signal, a stored signal, a choosing data input signal, a time clock signal, a restoring signal, a first signal channel, a scan latch, a second signal channel, a pulse latch, a normal output signal, an output signal, a first "OR gate", a second "OR gate", a third "OR gate", an "AND gate", and an "inverter". Herein, the "data signal" connects the "normal output signal", connects the "second signal channel", and together with the "scan data input signal" connects the "first signal channel". The "scan data input signal" together with the data signal connects the "first signal channel", connects the "scan latch", and connects the "second signal channel" in sequence, wherein the "second signal channel" connects the "pulse latch" and then connects the "normal output signal". The "stored signal" connects the "first signal channel" and the "first OR gate". The "choosing data input signal" connects the AND gate and then connects the "second OR gate". The "time clock signal" connects the "AND gate", connects the "second OR gate" and connects the "third OR gate". Thereafter, the restoring signal connects the "inverter", connects the second "OR gate" and connects the third "OR gate" in sequence, so as to form the device for storing pulse latch with logic circuit.

According to the device for storing pulse latch with logic circuit of the present invention, a data of the pulse latch is stored in the scan latch due to a stored pulse signal is inputted when the device is switched off, and a data of the scan latch is restored to the pulse latch due to a pulse signal is restored when the device is switched on.

The present invention uses two power supplies, including a primary power supply and a secondary power supply, so as to store data and to restore data by adding circuits.

In the present invention, it is possible to remain the secondary power supply only for supplying the storage circuit after the primary power supply is switched off, which means the storage circuit is able to be operated with the secondary power supply only. Thus, the non-power-off circuit is relatively small and the power consuming thereof is fewer, so as to achieve power saving and data storing.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Reference will now be made in detail to specific embodiments of the present invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

Figure 1A:
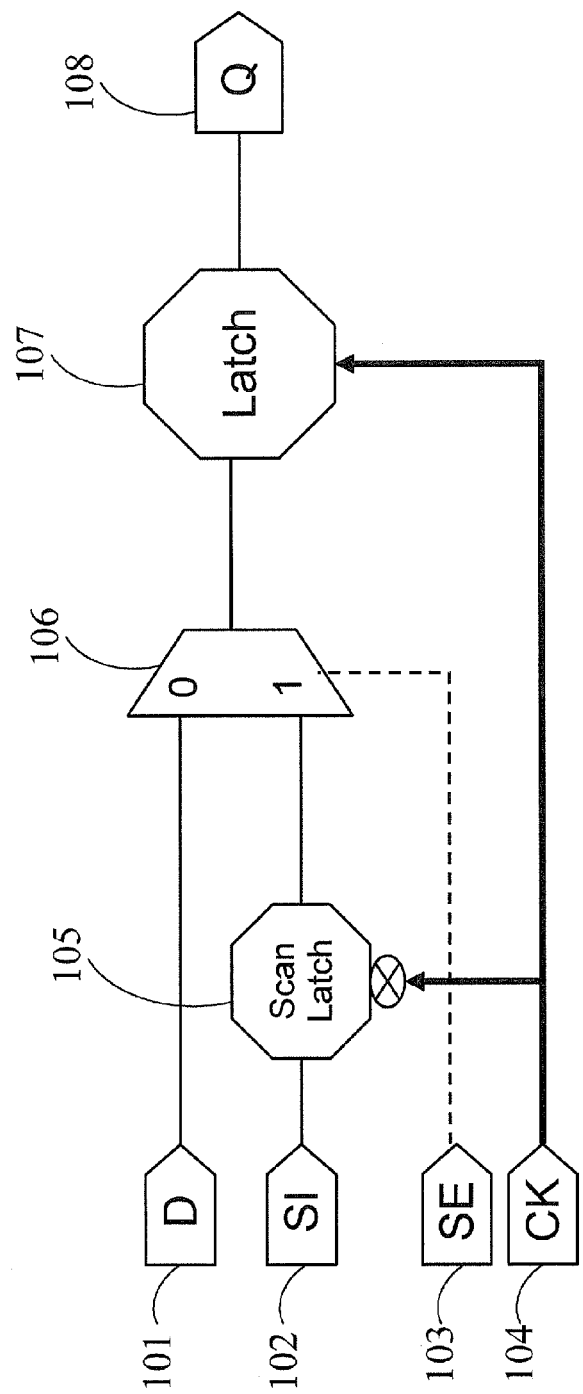
FIG. 1A illustrates a schematic diagram of a conventional latch circuit device.
Figure 1B:
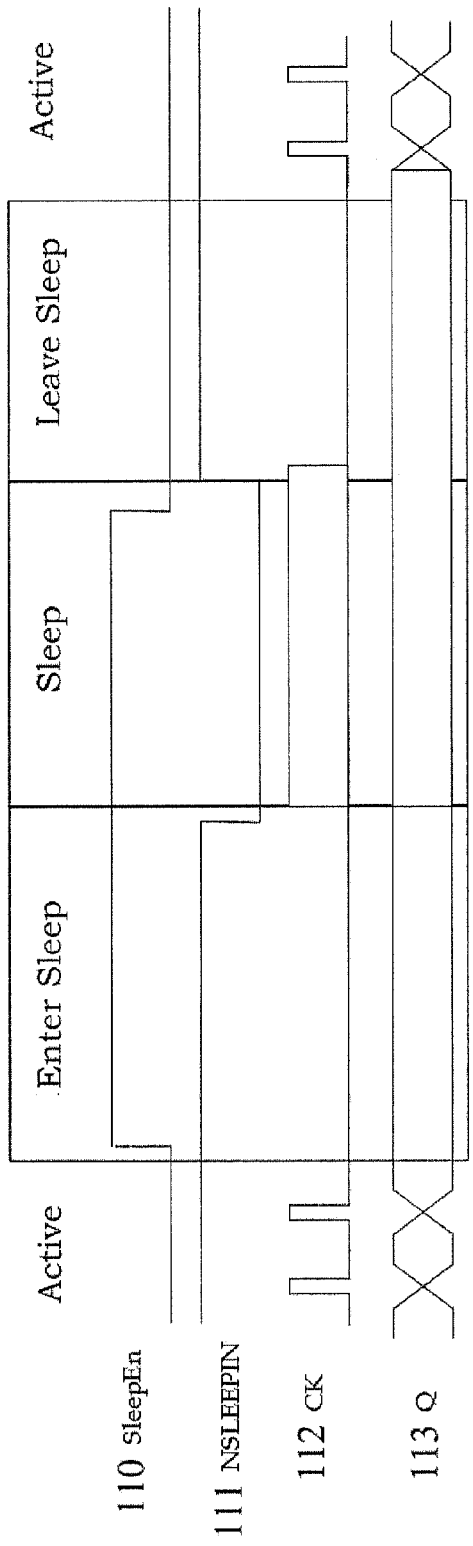
FIG. 1B illustrates a time clock signal diagram of a conventional latch circuit.
Figure 2A:
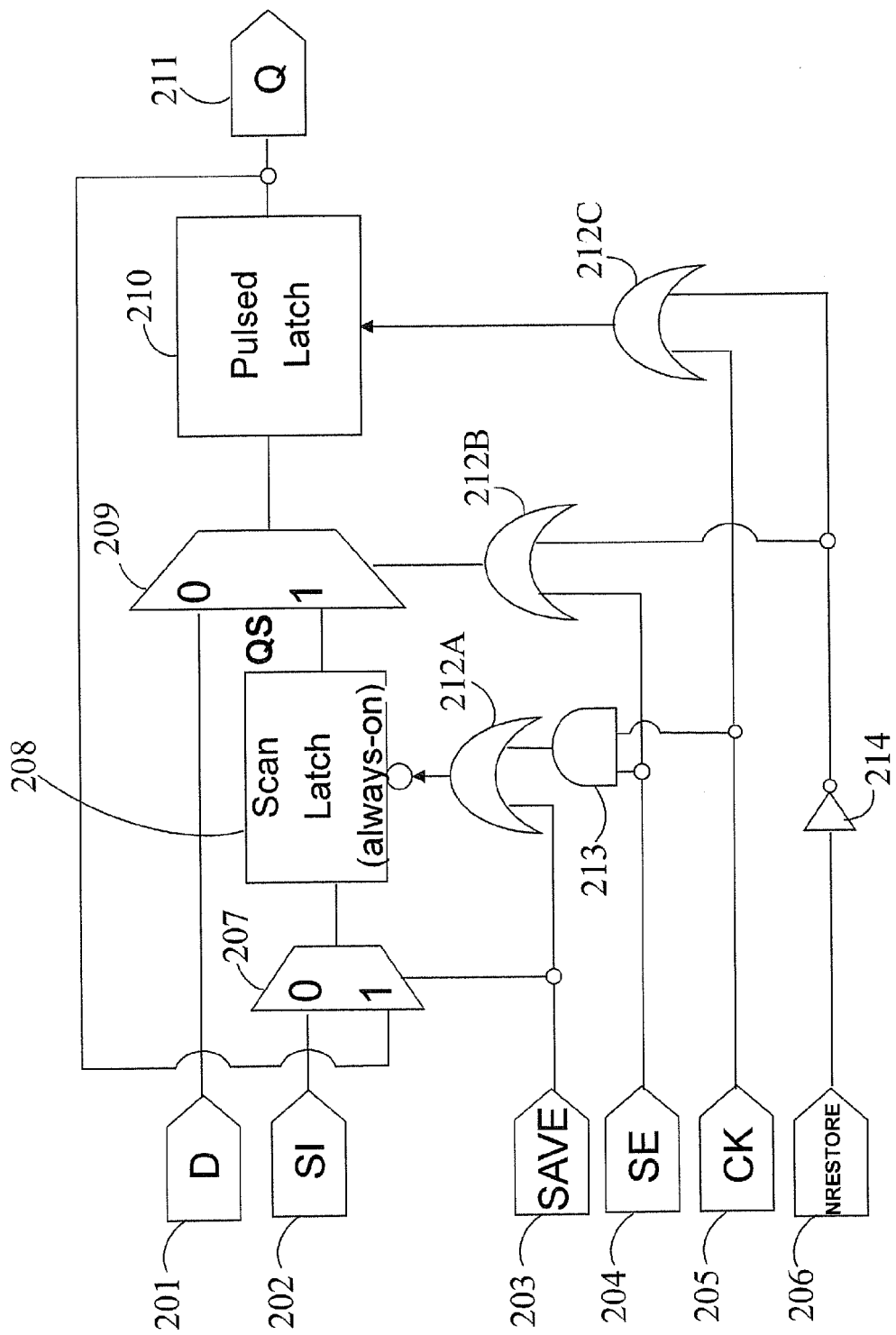
FIG. 2A illustrates a schematic diagram of a device for storing pulse latch with logic circuit according to an embodiment of the present invention.

The present invention is directed to a device for storing pulse latch with logic circuit, which may store the data and restore the data by two control signals and relative gates after being switched off and is described in detail as illustrated in FIG. 2A.

FIG. 2A illustrates a schematic diagram of a device for storing pulse latch with logic circuit according to an embodiment of the present invention, wherein the number 201 and the symbol "D" represent an data signal; the number 202 and the symbol "SI" (scan in) represent a scan data input signal; the number 203 and the symbol "SAVE" represent a storing signal; the number 204 and the symbol "SE" (scan enable) represent to choose a data input signal, the number 205 and the symbol "CK" represent a time clock signal; the number 206 and the symbol "NRESTORE" represent a restoring signal; the number 207 and the symbol "0", "1" represent a first signal channel of a digital signal being 0 and 1; the number 208 and the symbol "Scan Latch" represent a scan latch; the number 209 and the symbol "0", "1" represent a second signal channel of a digital signal being 0 and 1; the number 210 and the symbol "Pulsed Latch" represent a pulse latch; the number 211 and the symbol "Q" represent a normal output signal; the symbol "QS" represents an output signal; the number 212A represents a first OR gate; the number 212B represents a second OR gate; the number 212C represents a third OR gate; the number 213 represents an AND gate; and the number 214 represents an inverter.

Still referring to FIG. 2A, the data signal 201 connects the normal output signal 211 and the second signal channel 209. The data signal 201 further connects the first signal channel 207 together with the scan data input signal 202.

Continuously referring to FIG. 2A, the scan data input signal 202 connects the first signal channel 207 together with the data signal 201, and then connects the scan latch 208 and the second signal channel 209 in sequence, wherein the second signal channel 209 connects the pulse latch 210 and then connects the normal output signal 211.

Also referring to FIG. 2A, the storing signal 203 connects the first signal channel 207 and the first OR gate 212A.

Referring to FIG. 2A, the choosing data input signal 204 connects the AND gate 213 and then connects the second OR gate 212B.

Still referring to FIG. 2A, the time clock signal 205 connects the AND gate 213, the second OR gate 212B and the third OR gate 212C.

Also referring to FIG. 2A, the restoring signal 206 connects the inverter 214, the second OR gate 212B and the third OR gate 212C in sequence.

Figure 2B:
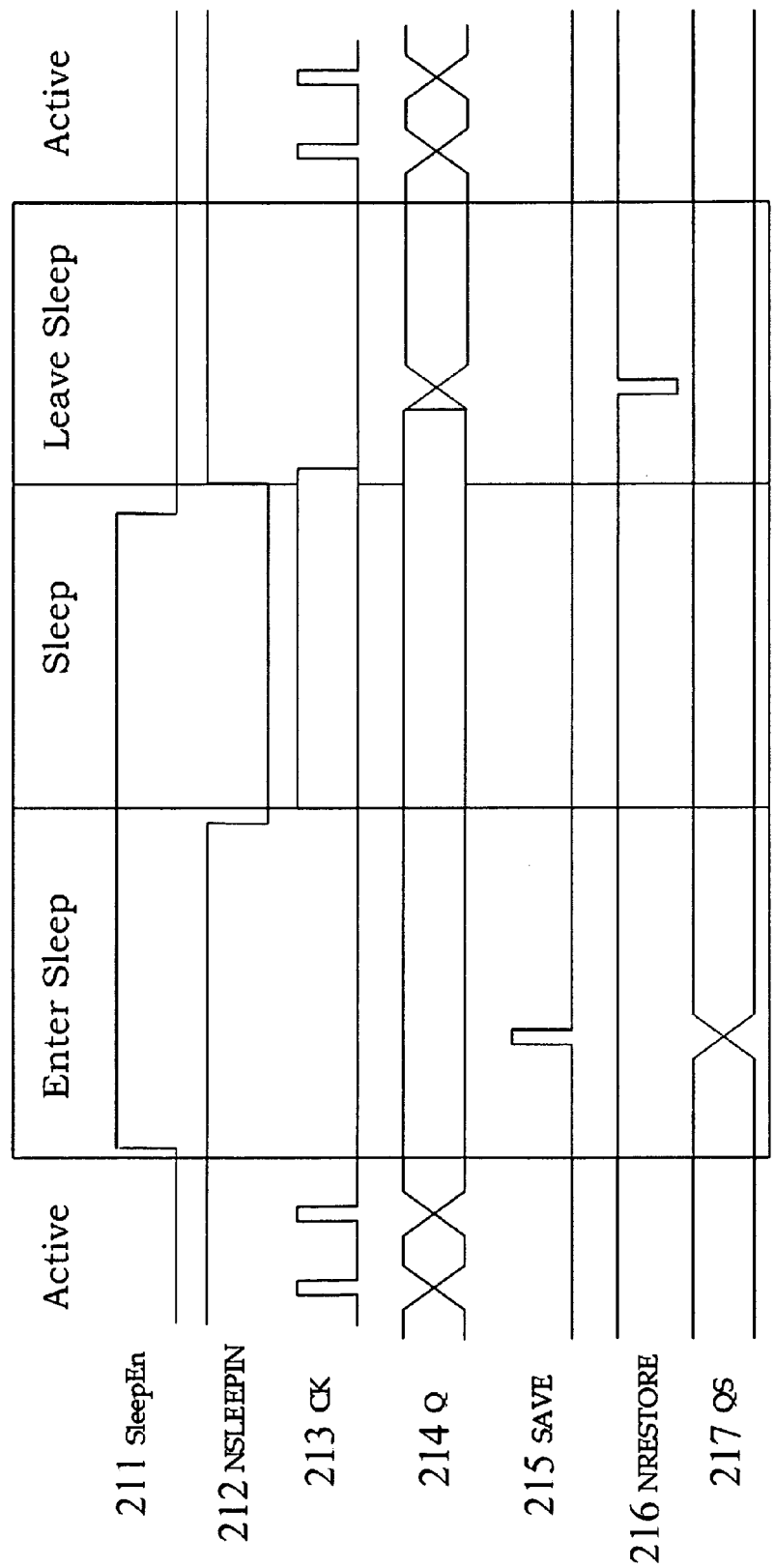
FIG. 2B illustrates a time clock signal diagram of a device for storing pulse latch with logic circuit according to an embodiment of the present invention.

FIG. 2B illustrates a time clock signal diagram of a pulse latch circuit, and the lateral axis is divided into 5 states comprising:

"Active" representing at a normal operating state;
"Enter Sleep" representing to enter into a sleep state;
"Sleep" representing at a sleep state;
"Leave Sleep" representing to leave from a sleep state; and
"Active" representing at a normal operating state.

Still referring to FIG. 2B illustrating a time clock signal diagram of a pulse latch circuit, the vertical axis at left side is divided into 4 states from top to bottom comprising:

a SleepEn step signal represented with the number 211;
a NSLEEPIN signal represented with the number 212 indicating that the device is switched off during the Sleep state;
a CK time clock signal represented with the number 213 indicating that there is no signal during the Sleep state;
a Q signal represented with the number 214 indicating that there is no signal during the Sleep state but there has a signal during the Leave Sleep state, since the signal is restored by a NRESTORE signal represented with the number 216;
a SAVE signal represented with the number 215 indicating that a pulse signal is inputted during the Enter Sleep state;
the NRESTORE signal represented with the number 216 indicating that a signal is restored during the Leave Sleep state; and
a QS signal represented with the number 217 indicating that 7 signals with all different functions are outputted.

According to FIG. 2B, the original signal can be restored by controlling the SAVE signal and the NSLEEPIN signal, and the SAVE signal and the NSLEEPIN signal enter into a low power region during the Leave Sleep state.

Figure 3:
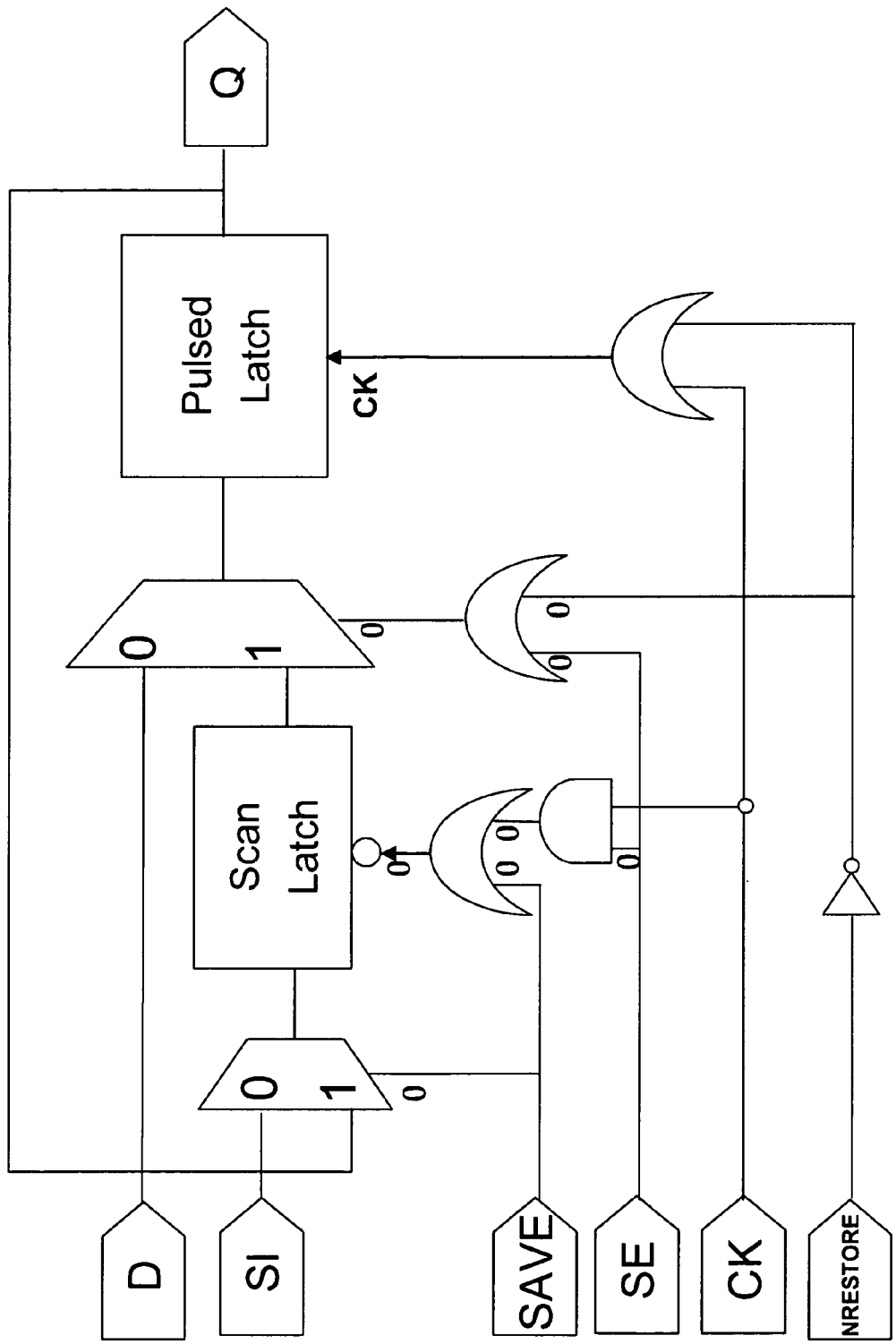
FIG. 3 illustrates a function module diagram of a device for storing pulse latch with logic circuit according to an embodiment of the present invention.

Accordingly, FIG. 3 illustrates a schematic diagram of a device for storing pulse latch with logic circuit according to an embodiment of the present invention, wherein the pulse latch is in the "Active" state when the present invention is in a Function Mode with conditions of SE=0, SAVE=0, NRESTORE=1.

Figure 4:
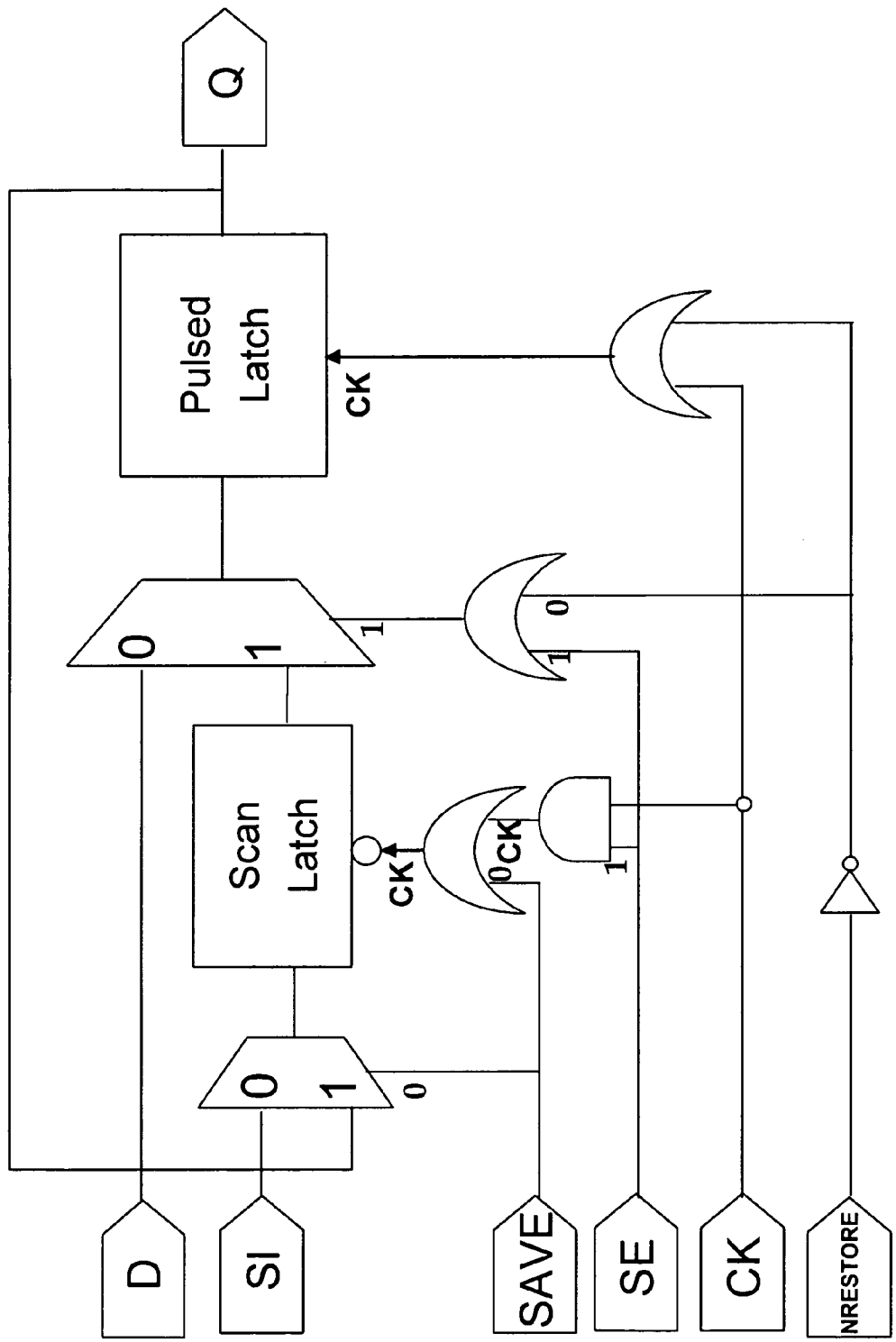
FIG. 4 illustrates a scan module diagram of a device for storing pulse latch with logic circuit according to an embodiment of the present invention.

In addition, FIG. 4 illustrates a schematic diagram of a device for storing pulse latch with logic circuit according to an embodiment of the present invention, wherein the scan latch and the pulse latch are formed as a register when the present invention is in a Scan Mode with conditions of SE=1, SAVE=0, NRESTORE=1, which means that the represented function of the device of the present invention in the Scan Mode is the same as the register used in most of the logic circuit design, and thus the device of the present invention may have the advantage of the register.

Figure 5:
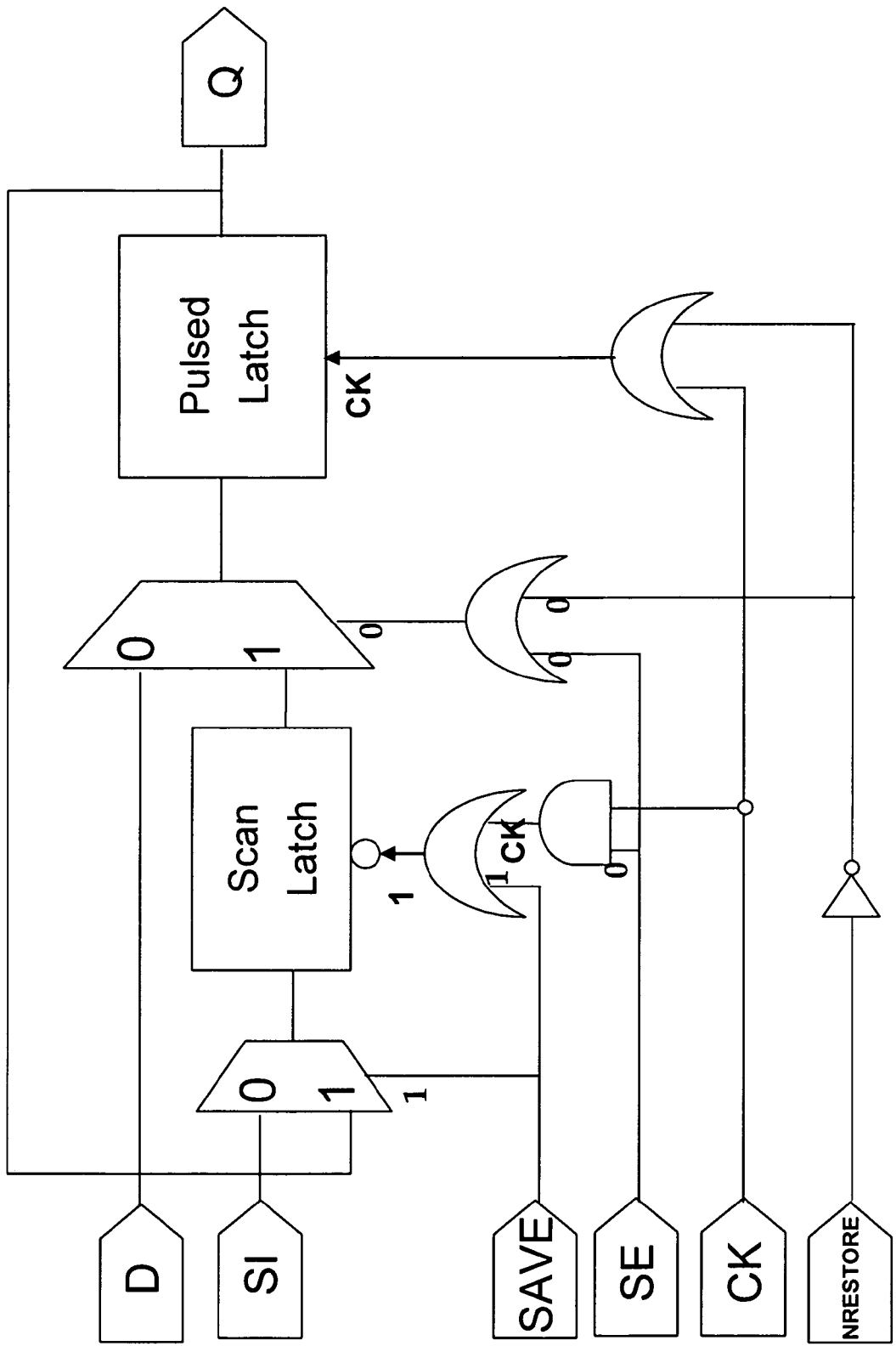
FIG. 5 illustrates a storing module diagram of a device for storing pulse latch with logic circuit according to an embodiment of the present invention.

FIG. 5 illustrates a schematic diagram of a device for storing pulse latch with logic circuit according to an embodiment of the present invention, which represents states of each signals when the present invention is in a Save Mode with conditions of SE=0, SAVE=1, NRESTORE=1. In another word, FIG. 5 represents that the data of the pulse latch is fed to the scan latch when the device is going to be switched off, i.e. storing the state of the pulse latch.

Figure 6:
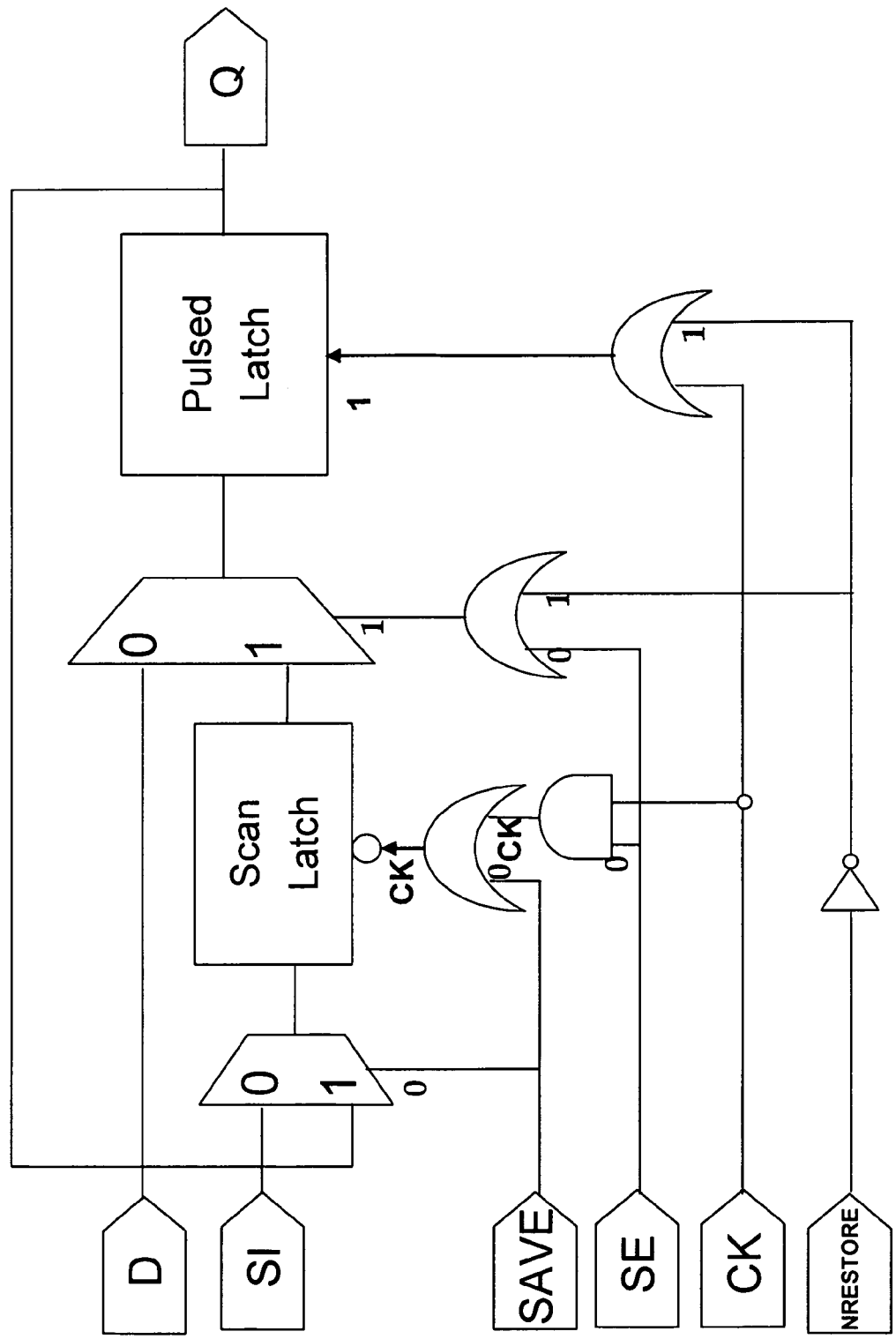
FIG. 6 illustrates a restoring module diagram of a device for storing pulse latch with logic circuit according to an embodiment of the present invention.

Finally, FIG. 6 illustrates a schematic diagram of a device for storing pulse latch with logic circuit according to an embodiment of the present invention, which represents states of each signals when the present invention is in a Restore Mode with conditions of SE=0, SAVE=0, NRESTORE=0. In another word, FIG. 6 represents that the data of the scan latch is fed back to the pulse latch and the information is temporarily stored in the scan latch.

Accordingly, the data of the pulse latch is stored in the scan latch due to the stored pulse signal is inputted when the device of the present invention is switched off. In addition, the data of the scan latch is restored to the pulse latch due to the pulse signal is restored when the device of the present invention is switched on.

In summary, the present invention discloses a device for storing pulse latch and thus having signal maintaining function, i.e., data storage function. The data is able to be stored when the device is switched off and is also able to be restored when the device is switched on again. The present invention uses two power supplies, including a primary power supply and a secondary power supply, so as to remain the secondary power supply for supplying the storage circuit only after the primary power supply is switched off. In addition, the present invention may also store data and restore data by adding circuits and is able to be operated with the secondary power supply only. Thus, the non-power-off circuit is relatively small and the power consuming thereof is fewer, so as to achieve power saving and data storing.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A device for storing pulse latch with logic circuit, comprising:
 a data signal connecting a second signal channel;
 a scan data input signal connecting a first signal channel;
 a SAVE signal connecting said first signal channel, and connecting a first OR gate;
 a scan enable signal connecting a second OR gate, and connecting an AND gate;
 a time clock signal connecting a third OR gate, and connecting said AND gate;
 a restoring signal (206) connecting an inverter;
 said scan latch connecting said first signal channel, connecting said second signal channel, and connecting a first OR gate;
 said second signal channel connecting a data signal, connecting a scan latch, said pulse latch, and connecting said second OR gate;
 said pulse latch connecting said first signal channel, connecting said second signal channel, connecting said normal output signal, and connecting said third OR gate; and
 said first OR gate connecting said SAVE signal, connecting said latch, and connecting said AND gate;
 said second OR gate connecting said scan enable signal, connecting said second signal channel, connecting said third OR gate, connecting said AND gate, and connecting said inverter;
 said third OR gate connecting said time clock signal, connecting said second OR gate, connecting said AND gate, connecting said inverter;
 said AND gate connecting said scan enable signal, connecting said time clock signal, and connecting said third OR gate; and
 said inverter connecting said restoring signal, connecting said second OR gate, and connecting said third OR gate;
 wherein a data of said pulse latch being stored in said scan latch due to said SAVE signal being inputted when the device is switched off, and wherein said data of said scan latch being restored to said pulse latch due to a pulse signal being restored when the device is switched on.

* * * * *